United States Patent [19]

Hurst

[11] 4,437,362
[45] Mar. 20, 1984

[54] TOOLS FOR HANDLING MAGNETIC ARTICLES

[75] Inventor: Jerry C. Hurst, Reading, Pa.

[73] Assignee: Western Electric Co., Inc., New York, N.Y.

[21] Appl. No.: 314,942

[22] Filed: Oct. 26, 1981

[51] Int. Cl.³ .......................... B25B 9/02; B25B 11/00
[52] U.S. Cl. ...................................... 81/43; 294/65.5; 81/3 R
[58] Field of Search .................. 81/43, 3 R; 294/65.5; 128/354; 269/8; 51/362

[56] References Cited

U.S. PATENT DOCUMENTS

| 1,510,254 | 9/1924 | Boyle | 81/43 |
| 2,641,212 | 6/1953 | Meilstrup | 269/8 |
| 2,760,809 | 8/1956 | Mallin | 294/65.5 |
| 2,976,075 | 3/1961 | Budreck | 294/65.5 |
| 3,771,084 | 11/1973 | Thon | 294/65.5 |

FOREIGN PATENT DOCUMENTS 738193 10/1955 United Kingdom ............... 294/65.5

OTHER PUBLICATIONS

RCA Technical Notes, "Magnetic Tweezers", Warren A. Mulle, Jun. 1972, Tn. No. 911.

*Primary Examiner*—James L. Jones, Jr.
*Assistant Examiner*—Debra S. Meislin
*Attorney, Agent, or Firm*—D. C. Watson

[57] ABSTRACT

A tool (10) for handling a magnetic article (50) includes a member (12) having a jaw (18) which is movable toward and away from a member (14) having a corresponding jaw (14). A holder (34) is associated with jaw (20) of member (14) for releasably holding an article (50) in cooperation with a magnetic field. A magnet (42) is associated with and removably applied by jaw (18) of member (12) in stages. To pick up an article (50), magnet (42) is moved by member (12) to establish a magnetic field at holder (34). To release an article (50), magnet (42) is withdrawn by member (12) to withdraw the magnetic field from holder (34). The article (50) is restrained at holder (34) until gravitational force overcomes the attraction of the withdrawing field and the article separates from tool (10).

5 Claims, 8 Drawing Figures

TOOLS FOR HANDLING MAGNETIC ARTICLES

TECHNICAL FIELD

This invention relates to tools for handling magnetic articles and more particularly to a tweezer tool which is operably simulative of one's natural finger movements for picking and placing articles.

BACKGROUND OF THE INVENTION

Tools, especially hand tools, may be considered as expedients to enhance the natural functions of one's arms, hands and fingers. For example, long tongs and fine needles provide access into areas where arms and fingers are too short or too large; long handle shears and wrenches provide increased strength through mechanical advantage; and tweezer tools provide increased dexterity in handling delicate articles. Such tools are particularly effective when they are operably simulative of one's natural movements because one can instinctively remember how to operate them.

The electronics industry is typical of a field where articles to be handled are small, light in weight and delicate in nature. For example, lids on chip carriers are only about 6-10 mm square and weigh about 0.15 to 0.25 grams. In another example, a paper-thin chip of silicon may contain a complex integrated circuit and may be only about 1 mm square. It is inappropriate to handle such lids or chips with conventional tweezers for many reasons. It is difficult to get under a lid or a chip for pickup and grasping a chip by squeezing upon both faces can be destructive of the integrated circuit. Moreover, the chips often have a magnetic material applied to a major surface so an array of chips can be handled on a magnetic carrier and the attraction thereto complicates a pickup procedure.

A popular method of handling the above articles, and especially chips, is by operation of a vacuum powered probe. The probe has a holding end with a vacuum port which communicates with a slender tube connected to a vacuum source. There is a valve which is finger operated to apply vacuum to a chip on pickup and to relieve the vacuum on placement. Problems with vacuum handling are high first cost and high maintenance cost of a pervasive vacuum service to a production line. Another problem accompanies the slender vacuum tube which drags about and can be disruptive of a work area.

In view of the foregoing, it is desirable to provide new and improved expedients to handle magnetic articles. A tool is desired to pick and place small, lightweight magnetic articles which are delicate in nature. Such tool should handle a flat article by non-destructively contacting only one surface of the flat article. In a tweezer tool embodiment, maximal dexterity should be provided by operably simulating the natural movements of human hands and fingers.

SUMMARY OF THE INVENTION

Many needs of the prior art are met by the instant invention which includes first and second members wherein a portion of the first member is movable toward and away from a portion of the second member. A holder is associated with the second member for releasably holding the article in cooperation with a magnetic field. A magnetic device is associated with and removably applied by the first member in stages. An article is picked up by establishing a magnetic field at the holder and released therefrom by withdrawing the field. The article is restrained by the holder until gravitational force overcomes the attraction of the withdrawing field and the article separates from the tool.

BRIEF DESCRIPTION OF THE DRAWING

The invention will be more readily understood from the following detailed description thereof when read in conjunction with the accompanying drawing, wherein.

Figure 1:
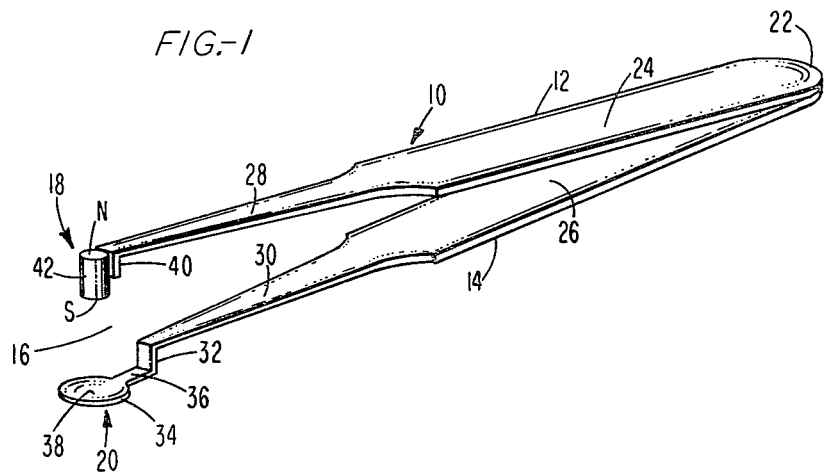
FIG. 1 is a pictorial view of a hand tool embodiment of the instant invention.

It can be seen that some elements in the figures are abbreviated or simplified to highlight certain features of the invention. Also, where appropriate, reference numerals have been repeated in the figures to designate the same or corresponding features in the drawing.

DETAILED DESCRIPTION

MAGNETIC ARTICLES

The invention will be described primarily with respect to thin magnetic articles having two major surfaces because such articles are difficult to pick from and place upon a flat surface with care and dexterity. The problem is further aggravated when the articles are very light in weight and especially so when a major surface of an article contains delicate features which are readily injured.

Figure 2:
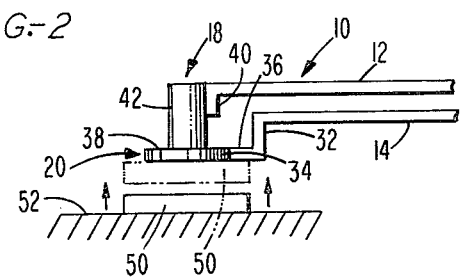
FIG. 2 is a partial view in elevation showing the tool in FIG. 1 operated to pick up a magnetic article.
Figure 3:
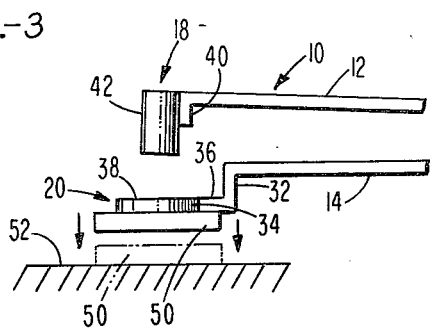
FIG. 3 is the same view as FIG. 2 showing the tool operated to release the article.
Figure 4:
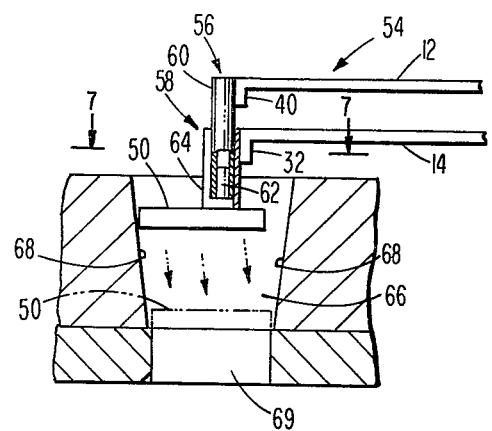
FIG. 4 is a partial view in elevation and section of another embodiment of the invention for placing magnetic articles in recesses.
Figure 7:
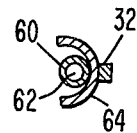
FIG. 7 is a cross-sectional view of the embodiment shown in FIG. 4 taken along line 7—7.

FIGS. 2, 3 and 4 disclose such an article 50 which is typically difficult to handle because of the above described problems. For purposes of illustration the article will often be referred to as a carrier lid 50 because its function is to cover and seal a generally box-like carrier containing an electronic chip with circuitry. Such lids 50 are typically about 9 mm square by about 0.25 mm thick, each weighing about 0.2 grams. The lid material may be gold plated Kovar which is a nickel based alloy and is magnetic, i.e., it is attracted to a magnet. Lid 50 mates to a carrier along all four sides and quite often a delicate frame of solder is attached to lid 50 for later reflow bonding in making a seal.

Figure 5:
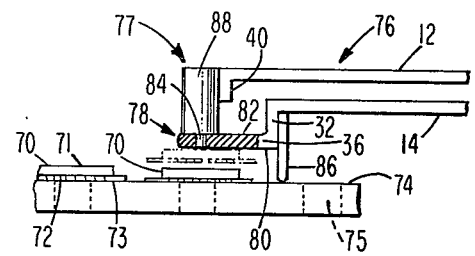
FIG. 5 is a partial view in elevation and section of another embodiment of the invention operated to pick chips from a magnetic carrier.
Figure 8:
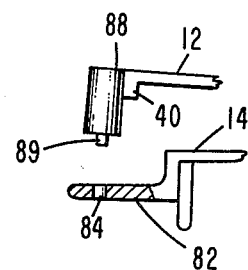
FIG. 8 is an elevation view of the embodiment shown in FIG. 5 wherein the free end of the magnet and the free end of the holder are disengaged from each other.

FIG. 5 discloses another article which is even more difficult to handle because of the problems mentioned. For purposes of illustration the article will be referred to as a chip 70 typical of those found in the semiconductor industry. Such chips are known to vary widely in size, for example, from less than 1 mm to greater than 7 mm square, and from less than 0.1 mm to greater than 0.5 mm in thickness. For an illustrative example, chip 70 will be assumed to be 0.9 mm square by 0.06 mm thick and weigh about 0.00000125 gram. The material of chip 70 is typically monocrystalline silicon and an integrated circuit (IC) is formed on and within an active surface which may be accessible surface 71 or inaccessible surface 72. To facilitate handling chip 70, magnetic ink is often applied to an inactive surface which adds about 0.025 mm to the thickness. In a further indication of the delicacy of chip 70, a plurality of tiny beam leads 73 are shown projecting from each side to connect the IC to the outside world.

The above described articles 50 and 70 were selected to indicate the versatility of the instant invention. However, it will be apparent that the invention is not limited to articles 50 or 70, nor is it limited to articles in the semiconductor industry. There are many other articles having various configurations, materials and surfaces in various fields of endeavor which are amenable to the practice of the invention.

HAND TOOL

FIG. 1 shows a hand tool embodiment of the instant invention designated generally by the numeral 10. Tool 10 has elongated members 12 and 14 which are similar and generally symmetrical except at an active end 16 where they have different forms of jaws designated generally and respectively by the numerals 18 and 20. Preferably the members 12 and 14 may be made of a non-magnetic stainless steel and be bondably joined at a closed end 22, for example by spot welding. The members 12 and 14 are preferably spring tempered and biased apart in the inactive condition as shown in FIG. 1. Tool 10 is configured to fit one's hand while permitting visual access to active end 16. For example, portions 24 and 26, respectively, of members 12 and 14 are made wide enough to prevent the tool 10 from turning in one's hand. Also, portions 28 and 30, respectively, of members 12 and 14 are tapered to permit better viewing of active end 16 and to facilitate application of a minimally light pressure upon an article.

Jaw 20 is adapted for contacting an article with uniformly light pressure, for permitting lateral displacement of a seized article and for restraining an article from turning over in a magnetic field. For example, an offset arm 32 is made minimally long to accommodate one's knuckles when picking an article off a flat surface or suitably longer if an article is to be placed in a recess. Attached to arm 32 is a holder 34 having a neck 36 and a pan 38 for contacting an article. Pan 38 may be of any suitable area and configuration to suit an article to provide a desired uniformly applied, light contact pressure and to avoid having an article turn toward jaw 18 under magnetic attraction.

Jaw 18 includes an offset arm 40 which is made long enough to mount a magnet thereon by some appropriate means. For an illustrative example, a permanent type magnet 42 having a generally cylindrical shape is shown mounted to arm 40 by an adhesive (not shown). Magnet 42 is magnetized through its length so each end is of opposite polarity as indicated.

OPERATION

The operation of tool 10 may best be explained by reference to FIGS. 2 and 3 in picking and placing a magnetic lid 50 with respect to a flat, horizontal surface 52. Members 12 and 14 are squeezed together for pickup much as one would squeeze one's thumb and forefinger together to grasp an object on a table. Jaw 18 is moved to jaw 20 which removably applies magnet 42 to holder 34. When pan 38 is contacted to the lid 50 such lid is releasably held at holder 34 in cooperation with a magnetic field associated with magnet 42, as shown in FIG. 2. To place lid 50 on surface 52, one merely positions tool 10 as shown in FIG. 3 and relaxes members 12 and 14 as one would relax a thumb and forefinger in placing an object on a table. Jaw 18 moves from jaw 20 by spring bias between members 12 and 14 and the magnet 42 and its field are withdrawn from holder 34. Lid 50 is restrained from following magnet 42 by pan 38 of holder 34. Lid 50 separates from tool 10 when the attraction of the withdrawing field is overcome by gravitational or other operative force and the lid remains upon (or falls upon) surface 52.

PLACING ARTICLES IN RECESSES

Referring again to FIG. 1, it was mentioned that offset arm 32 in jaw 20 is made longer than shown if an article is to be placed in a recess. However, there is a practical limit on the closing distance between jaw 18 and 20. Consequently, when offset arm 32 is made much longer for work in deep recesses, the length required for magnet 42 may be considered unsuitably long. Therefore, another embodiment of the invention as shown in FIG. 4 has been developed to place articles such as lids 50 in deep recesses.

A tool designated generally by the numeral 54 has a jaw 56 attached to member 12 and a jaw 58 attached to member 14. Jaw 56 includes a leg 60 which may preferably be a metal tube for ease of bonding leg 60 to arm 40, such as by welding. Leg 60 includes a magnet 62 at its free end attached thereto by friction fit, adhesive or mechanical device. At jaw 58 there is seen a holder 64 preferably in the form of a vertical channel attached to offset arm 32, such as by welding. Such channel has its open slot facing forward of tool 54, i.e., to the left in FIG. 4. A bottom free end of the channel is cut transversely of holder 64 to provide a "U" smooth peripheral ridge, all points thereof lying along a common plane.

In operation of tool 54, one squeezes members 12 and 14 together to move jaw 56 toward jaw 58 thereby guidably translating leg 60 and magnet 62 within holder 64. A magnetic field is thereby established at the free end of holder 64 which end is contacted to a lid 50. Such lid 50 is releasably held thereat in cooperation with the magnetic field and one manipulates the tool 54 to lower the article 50 within a recess 66 having tapered walls 68. When lid 50 contacts a wall 68, it is laterally moved over the free end of holder 64 to center upon a typical ceramic chip carrier 69. Then one relaxes members 12 and 14 to withdraw the magnetic field from the free end of holder 64. Gravitational force overcomes the attraction of the field and lid 50 separates from tool 54.

It can be seen that there are several cooperative relationships between or among features of tool 10 which are readily ascertained by one of ordinary skill in the art. For example, the field established by magnet 42 is related to the weight and material of lid 50 for proper retention thereof. For a lid 50 of Kovar weighing about 0.2 grams, a 1.73 mm diameter magnet, about 6 mm long was found satisfactory for tool 10. The material for magnet 42 may be Alnico VIII as designated and sold by Indiana General Company, a Division of Electronic Memories and Magnetics Corporation, Valparaiso, Ind. For a lid 50 which is about 9 mm square a pan 32 about 5 mm in diameter was found to be satisfactory for the intended purpose. It will be appreciated that magnet 62 of tool 54 performs similar functions to that of magnet 42 of tool 10 and may be of similar design. The retaining end of holder 64 of tool 54 was formed about 5 mm wide to properly support lid 50 in operation of tool 54 as illustrated in FIG. 4 and described above.

CHIP HANDLING

IC chips are often formed from a typical 50–100 mm diameter slice of monocrystalline silicon (called a wafer) by a long series of manufacturing steps, the final ones of which may be performed while the wafer is mounted on a wax base. Thereafter the IC chips in the wafer may be isolated while still on the wax and the base may be turned and mounted to a magnetic block 74 of the type shown in FIG. 5. The chips 70 may receive magnetic ink, the wax removed and magnetic domains 75 then retain the isolated and separated chips 70 for handling. It will be appreciated that there is then much investment in each chip and picking them from block 74 should be done with care and dexterity.

As seen in FIG. 5, a tool 76 for handling such chips 70 advantageously includes a jaw 77 attached to member 12 and a jaw 78 attached to member 14. Jaw 78 includes a holder 80 attached to offset arm 32 but holder 80 does not have a wide pan because the chips 70 are only about 0.9 mm square. Consequently, holder 80 includes an extension of neck 36 which is about 1 mm wide to form a narrow pan 82. Pan 82 may preferably have an aperture 84 therein and arm 32 may include a stand-off member 86 for reasons which will be explained hereinafter.

Jaw 77 includes a magnet 88 which is similar to the aforedescribed magnet 42 except that magnet 88 has a major portion and a minor portion 89 wherein only the minor portion 89 is formed and aligned to at least enter the aperture 84 in pan 82. Magnet 88 and aperture 84 cooperate to cause flux to concentrate in the center of pan 82 for releasably holding an article thereat.

It will be appreciated that an operator of a tool 76 could apply concentrated pressure upon pan 82 and, therefore a chip 70, in a well intentioned effort to fully contact said chip. Heavy pressure thereon could injure a silicon substrate or an IC or both. To avoid such pressure, the stand-off member 86 contacts block 74 and pan 82 is thereby positioned about 1 mm above chip 70 as it rests on said block.

In operation of tool 76 without the offset member 86 the operator squeezes members 12 and 14 to bring magnet 88 toward pan 82 to removably apply a magnetic field when the chip 70 is contacted for pickup. The field established by magnet 88 is of sufficient strength relative to the weight and material of chip 70 that said chip is preferentially attracted to holder 80 rather than block 74 so chip 70 can be removed therefrom. When non-pressure pickup is desired, the stand-off member 86 is attached to jaw 78 and contacted to block 74. Then the relationships between the magnetic fields of tool 76 and carrier block 74 and the weight and material of chip 70 are so established that chip 70 moves without external contact from the block 74 to the holder 80. It will be appreciated that only the attactive force of magnet 88 (less gravitational force) is thereby applied to chip 70 and such force is known, repetitive and manageable.

GENERAL CONSIDERATIONS

From the foregoing it is evident that tools 10, 54 and 76 are operably simulative of one's hand and finger movements and, therefore, are particularly suited to manual operation. For operably unnatural embodiments of such hand tools, members 12 and 14 could be constructed in a crossed relation thereby adapting the tools for normally active rather than normally inactive engagement with a magnetic article.

It will be appreciated that tool 10 may have many equivalent, substituted features within the scope of the invention. For example, members 12 and 14 need not be bonded together at end 22 but may be hinged, bolted or otherwise fixedly or detachably coupled together. Further, members 12 and 14 need not be spring tempered but may be biased apart by any of a variety of other means, such as a compression spring. Magnet 42 need not be a permanent type but could be an electromagnet and movement of member 12 could operate a switch to establish a desired magnetic field at a holder 34. Similar substitutions are within the scope of the invention as applied to tools 54 and 76.

Figure 6:
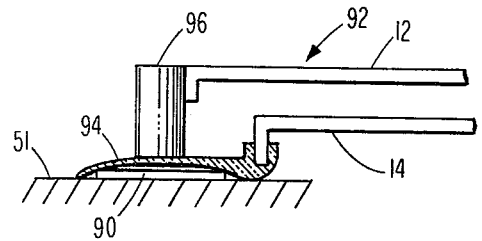
FIG. 6 is a partial view in elevation and section of another embodiment of the invention operated on an article by contacting its peripheral edges.

In a further illustration of the versatility of the invention, FIG. 6 shows an article being handled by contacting its peripheral edges. For purposes of illustration the article will be assumed to be a substantially circular semiconductor wafer 90 described generally heretofore for making chips 70. A tool 92 may have a pan 94 which resembles an inverted saucer and is about 20 mm in diameter for an assumed 15 mm diameter wafer 90 weighing about 0.15 grams. A magnet 96 is selected of about the same characteristics as magnet 42 in FIG. 1. Note here that only the edges of the wafer are in contact with pan 94. Of course the diameter and shape of pan 94, the weight of wafer 90 and the properties of magnet 96 are interrelated and can be ascertained by one of ordinary skill in this art with a minimum of experimentation. Because pan 94 may become large in diameter for handling large wafers the visual access to the work area may become obscured. Consequently, pan 94 may be made of a transparent material such as a clear plastic which is advantageously non-magnetic and transmissive of light.

It will also be appreciated that the invention is not limited to manual operation. For example, first and second members such as members 12 and 14 could be mechanically operated in a singular or multiple manner to pick and place one or more magnetic articles. Such mechanical operation would be especially advantageous where a vacuum environment is indicated and conventional vacuum handling is inoperable.

There have been illustrated herein certain embodiments of the invention and certain applications thereof. Nevertheless, it is to be understood that various modifications and refinements may be made and used which differ from these disclosed embodiments without departing from the spirit and scope of the present invention.

What is claimed is:

1. A tweezer tool for handling a magnetic article, comprising:
    first and second elongated tweezer members, joined at one end and biased apart and tapered to substantially free ends where at least a portion of said first member is movable toward and away from a corresponding portion of said second member;
    a substantially non-magnetizable and planar means for holding an article, said means having an aperture to pass flux therethrough and being associated with the free end of the second member whereat said means is interposed between the first member and contact with a surface of the article for releasably holding the same in cooperation with a magnetic field, said article being movable laterally along said holding means; and a substantially permanent magnet having a major and a minor portion and being affixed to the free end of the first member, said magnet having only the minor portion formed and aligned to enter the aperture in the holding means, said magnet being of sufficient strength and being removably applied by operation of the first member in stages to:

pick up an article by establishing the magnetic field of sufficient strength relative to the weight and material of the article and to any opposing external forces acting thereupon that said article is preferentially attracted to the holding means when the tool is applied to pick up the article, and to release an article from the tool by withdrawing the magnet and the field, the article being restrained by the holding means until gravity and any other opposing external forces overcome the attraction of the withdrawing field and said article separates from the tool.

2. A tool as in claim 1, wherein the article handled is a thin, substantially planar magnetic article, such as a semiconductor chip having a magnetic coating, said chip being supported on a magnetic carrier exerting a force on the chip externally of and opposite to the magnet of the tool, further comprising:

the relationships between the magnetic fields of the tool and the carrier and the weight and material of the chip being so established that the chip is attracted to and moves without external contact from the carrier to the holding means positioned closely above the chip on the carrier.

3. A tool as in claim 2, being operable by a human hand, further comprising:

the first and second members being dimensioned and shaped in a manner substantially suited to a human hand and being operably simulative of natural, finger movements, the article being picked up by squeezing the tool and released by relaxing the tool.

4. A tool as in claim 1, wherein the holding means further comprises:

means formed in the manner of an inverted saucer having its convex surface facing the first elongated tweezer member for restraining an article having a major surface attracted inwardly of the saucer, such article being handled by contacting its peripheral edges.

5. A tool as in claim 1 or 4, wherein the holding means includes transparent means to permit visual access from above to an article while it is being handled.

* * * * *